United States Patent
Fischer et al.

(10) Patent No.: US 6,473,324 B2
(45) Date of Patent: Oct. 29, 2002

(54) LAYOUT OF A SENSE AMPLIFIER WITH ACCELERATED SIGNAL EVALUATION

(75) Inventors: Helmut Fischer, Taufkirchen; Michael Markert, Augsburg; Helmut Schneider, München; Sabine Schöniger, Hausham, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/849,908

(22) Filed: May 4, 2001

(65) Prior Publication Data

US 2001/0048620 A1 Dec. 6, 2001

(30) Foreign Application Priority Data

May 4, 2000 (DE) .......................................... 100 21 776

(51) Int. Cl.[7] .................................................. G11C 5/06
(52) U.S. Cl. .......................... 365/63; 365/205; 365/214
(58) Field of Search ................................. 365/205, 207, 365/208, 214, 63

(56) References Cited

U.S. PATENT DOCUMENTS

| | | | |
|---|---|---|---|
| 4,644,637 A | | 2/1987 | Temple |
| 4,954,992 A | * | 9/1990 | Kumanoya et al. ......... 365/207 |
| 5,422,853 A | | 6/1995 | Miyamoto .................. 365/205 |
| 6,195,282 B1 | * | 2/2001 | Foss ........................... 365/149 |
| 6,195,302 B1 | * | 2/2001 | Hardee ........................ 365/205 |
| 6,249,471 B1 | * | 6/2001 | Roy ........................... 365/207 |

* cited by examiner

*Primary Examiner*—David Nelms
*Assistant Examiner*—Gene N. Auduong
(74) *Attorney, Agent, or Firm*—Laurence A. Greenberg; Werner H. Stemer; Gregory L. Mayback

(57) ABSTRACT

A layout of a sense amplifier configuration for a semiconductor memory is described. The layout has a plurality of read/write amplifiers, extending as strips in the form of rows one under the other, and having NMOS and PMOS transistors. At least one of the two driver transistors is disposed with its doping regions between the associated NMOS or PMOS transistors of the read/write amplifiers. A gate of the driver transistor is configured as a two-strip gate, in order to accelerate the signal evaluation in the sense amplifiers.

9 Claims, 5 Drawing Sheets

LAYOUT OF A SENSE AMPLIFIER WITH ACCELERATED SIGNAL EVALUATION

BACKGROUND OF THE INVENTION

Field of the Invention

The present invention relates to the layout of a sense amplifier configuration for a semiconductor memory having a plurality of read/write amplifiers, extending as strips in the form of rows one under the other, with NMOS and PMOS ok transistors. The sense amplifier configuration also has two driver transistors. The driver transistors extend perpendicularly to the read/write amplifiers and are formed as strips in the form of columns over a plurality of read/write amplifier rows. The sense amplifier configuration further has non-inverted and inverted bit lines extending in the read/write amplifier rows.

Layouts of this type are generally known in semiconductor DRAMs, in each case two driver transistors provide, during the sense operation, a signal for the PMOS transistors of numerous read/write amplifiers and also a signal for the corresponding NMOS transistors of the numerous read/write amplifiers. As the clock frequency of DRAMs increases, in particular the rapid provision of the signals for the sense operation acquires increasing importance. The further the signal is developed in particular during the first read or write access of a cycle, the more quickly the respective sense amplifier node developed by the PMOS transistors reaches its final value. The same applies correspondingly to the signal for the and the nodes of the read/write amplifiers that are developed by the NMOS transistors.

SUMMARY OF THE INVENTION

It is accordingly an object of the invention to provide a layout of a sense amplifier with accelerated signal evaluation, which overcomes the above-mentioned disadvantages of the prior art devices of this general type, in which the signal evaluation in the sense amplifiers is accelerated and, for example, the acceleration of the development of the side driven by the PMOS transistors.

With the foregoing and other objects in view there is provided, in accordance with the invention, a layout of a sense amplifier configuration for a semiconductor memory. The layout of the sense amplifier configuration contains a plurality of read/write amplifiers extending as strips in rows one under another and has NMOS and PMOS transistors. Two driver transistors are connected to the read/write amplifiers. The two driver transistors are strip shaped and extend perpendicularly to the read/write amplifiers in a form of columns over the rows of the read/write amplifiers. At least one of the two driver transistors has doping regions disposed between associated NMOS or PMOS transistors of the read/write amplifiers. The at least one of the two driver transistors has a gate formed as a two-strip gate with two strips. Non-inverted and inverted bit lines extend in the rows of the read/write amplifiers.

The object of the invention is achieved by virtue of the fact that at least one of the two driver transistors is disposed with its doping regions between the associated NMOS or PMOS transistors of the read/write amplifiers, and in that the gate of the driver transistor is a two-strip gate. The doubling of the width of the driver transistor makes it possible to significantly increase the signal development in the sense amplifier without having to increase the area requirement in a relevant manner. Particularly when the PCS driver transistor is realized according to the invention, a compact structural size is realized in conjunction with distinctly improved driver power.

The insertion of transverse webs between the two gate strips of the driver transistor enables balancing of the signal supply of the PMOS transistors of the read/write amplifiers, optimization of the gate resistance of the driver transistor and, moreover, setting of the gate capacitance of the driver transistor for the NMOS transistors. The same applies correspondingly to the driver transistor for the NMOS transistors. In this way, the speed of the signal development and the noise filtering can be set in a manner optimized in an application-specific manner. The space-saving "dual gate technique" makes it possible, in a simple manner, to provide a plurality of gate transverse webs in each case. It is advantageous for the gate transverse web to extend parallel to the read/write amplifier strip at least in the outer edge region thereof, in order simultaneously to be able to realize additional contact-connection of the gate of the driver transistor in a simple manner.

In accordance with an added feature of the invention, gate transverse webs are provided. The at least one of the two driver transistors has a channel width and the two strips of the two-strip gate are conductively connected to one another by the gate transverse webs over a part of the channel width.

In accordance with another feature of the invention, each of the gate transverse webs extends parallel to a respective one of the read/write amplifiers in a form of a strip at least in an outer edge region thereof.

Other features which are considered as characteristic for the invention are set forth in the appended claims.

Although the invention is illustrated and described herein as embodied in a layout of a sense amplifier with accelerated signal evaluation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
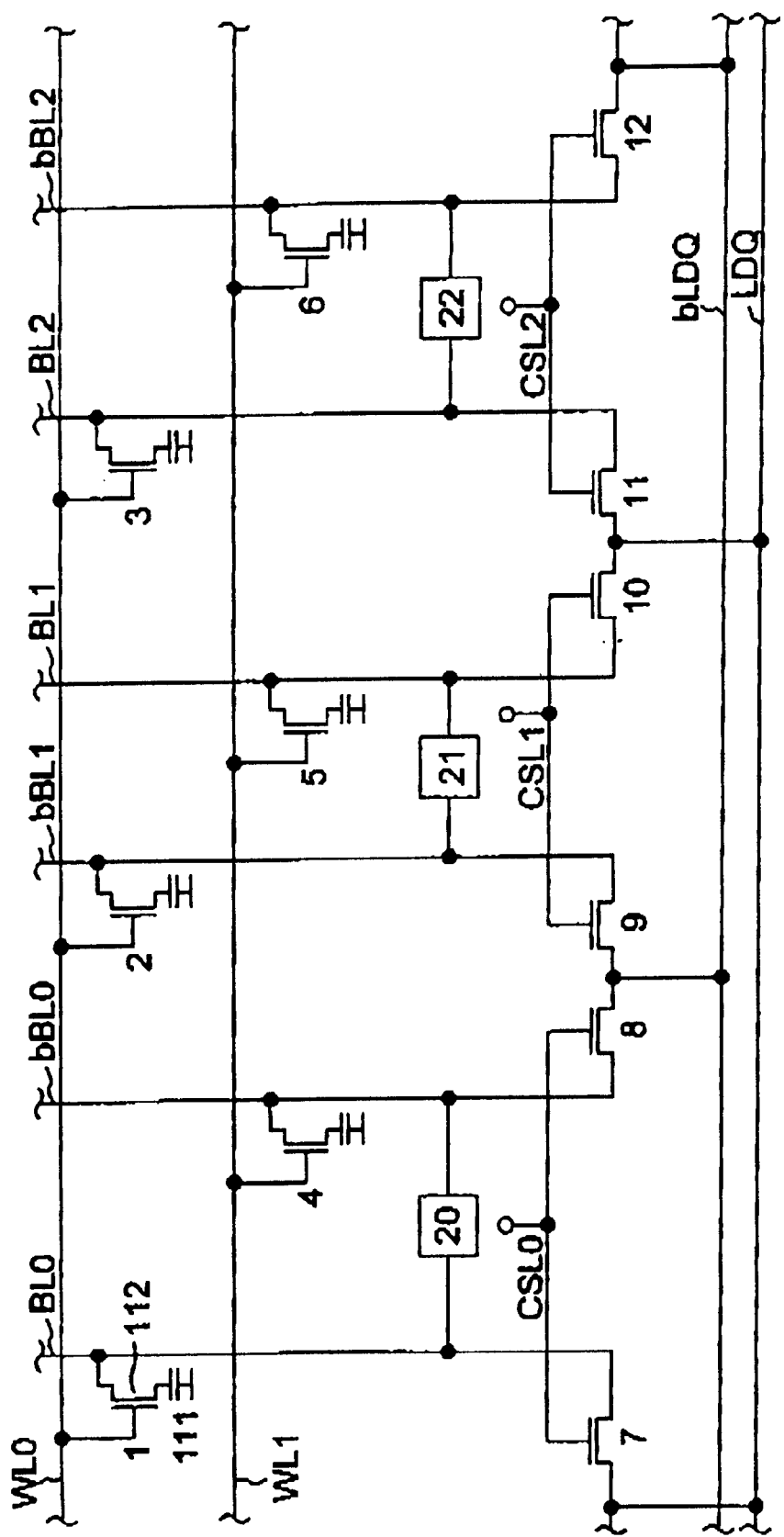
FIG. 1 is a basic circuit diagram of a semiconductor memory.

In all the figures of the drawing, sub-features and integral parts that correspond to one another bear the same reference symbol in each case. Referring now to the figures of the drawing in detail and first, particularly, to FIG. 1 thereof, there is shown a detail of a memory cell array of a semiconductor memory having memory cells 1, . . . , 6. Each of the memory cells contains a storage capacitor 111 which, at one terminal, is connected to a reference-ground potential, e.g. ground, and, at the other terminal, is connected to a drain-source path of a MOS selection transistor 112. The other terminal of the selection transistor 112 is connected to a bit line, e.g. BL0. For reading in and reading out the data information that is to be stored or is stored in the capacitor 111, the transistor 112 is switched on by a corresponding control signal on a word line WL0, with the result that the capacitor 111 is conductively connected to the bit line BL0. A capacitance of the storage capacitor 111 is significantly smaller than the bit line capacitance. The other memory cells 2, . . . , 6 are embodied in a corresponding manner. The bit line bBL0 is disposed directly beside the bit line BL0. The memory cell 4 is connected to the bit line bBL0, the selection transistor of memory cell 4 can be driven via another word line WL1. The two bit lines BL0, bBL0 are connected to a sense amplifier 20 on input and output sides. When data information is read from the memory cells 1 or 4, the corresponding signal from the storage capacitor 111 is applied to the respective bit line BL0 or bBL0 and amplified by the sense amplifier 20. The sense amplifier 20 is embodied as a read/write amplifier, as is described in more detail below (FIG. 2). The stored information bit is stored in non-inverted form in the memory cell 1, since the bit line BL0 is connected to that input of the sense amplifier 20 which effects non-inverted amplification. In contrast, the information bit stored in the memory cell 4 is stored in inverted form, since the bit line bBL0 is connected to that input of the sense amplifier 20 which effects inverted amplification. In a corresponding manner, the memory cells 2, 5, 3 and 6, the bit lines BL1, bBL1, BL2 and bBL2 are connected to corresponding sense amplifiers 21 and 22 of the semiconductor memory according to FIG. 1. The memory cells 1, 2, 3 are selected by the word line WL0, and the memory cells 4, 5, 6 are selected by the other word line WL1. The bit lines run parallel to one another. In the viewing direction perpendicular to the course of the word lines WL0, WL1, a first inverted bit line is followed by a second inverted bit line; a second inverted bit line is followed by a first non-inverted bit line; a first non-inverted bit line is followed by a second non-inverted bit line. Depending on the application-specific conditions, the non-inverted and inverted bit lines may, however, also be disposed in a different order.

After the amplification operation during read-out, the data present on the bit lines are output to two collective lines LDQ, bLDQ. The non-inverted collective line LDQ receives the signals of the non-inverted bit lines BL0, BL1, BL2. In a corresponding manner, the inverted collective line bLDQ forwards the read-out data information of the inverted bit lines bBL0, bBL1, bBL2. The bit lines are connected to the collective lines via corresponding switching transistors 7, . . . 12. Via the collective lines, the data bit read out is conducted in the direction of the output of the semiconductor memory. The switching transistors which are assigned to the bit lines BLi which lie next to one another and are also connected to the same sense amplifier are controlled by a common control signal CSL0, CSL1 and CSL2, respectively. Overall, then, during a read-out operation, the data information that is to be read out is fed into the sense amplifier 20 in a single-phase manner but is provided as a differential data signal on the output side and transferred to the collective lines LDQ, bLDQ in a differential manner. The data from two data lines of the same type (i.e. both inverted or both non-inverted) which are disposed adjacent directly next to one another are output to the same collective line bLDQ or LDQ (FIG. 1).

In accordance with FIG. 2, the sense amplifier 20 contains, in a known manner, a read/write amplifier having the parallel circuit formed by in each case two series-connected transistors of the NMOS and PMOS type N2, N3, P2, P3. In this case, the series-connected transistors P2 and N2 and the series-connected transistors P3 and N3 of the read/write amplifier lie between read/write amplifier nodes NCS and PCS. The gates of the transistors P2 and N2 are connected to one another. Likewise, the gates of the transistors P3 and N3 are connected to one another. The read/write amplifier node NCS is connected to ground via a drain-source path of an NMOS driver transistor N1 of the sense amplifier 20. A sense amplifier control signal NSET is applied to a gate of the driver transistor N1. In a corresponding manner, the second read/write amplifier node PCS is connected to a positive supply potential VD of the semiconductor memory via a drain-source path of a PMOS driver transistor P1 of the sense amplifier 20. A control signal bPSET is in turn applied to the gate of the driver transistor P1. The potentials of the nodes NCS and PCS are thus developed via the driver transistors N1 and P1 during the sense operation. In this case, in a known manner, the two driver transistors N1, P1 shown in FIG. 2 also drive numerous other differential amplifiers 20, 21, 22, . . . and are therefore simultaneously connected to numerous read/write amplifier nodes NCS, PCS (not shown in FIG. 2). The bit lines BL0 and bBL0 of the semiconductor memory in accordance with FIG. 1 are respectively connected via an NMOS turn-off transistor N4, N5 to the sense amplifier 20. In this case, the bit line BL0 connects the two drains of the read/write amplifier transistors P2, N2 to the gates of the two read/write amplifier transistors P3, N3 disposed opposite in the circuitry in FIG. 2. A common node SA0 is referred to as a sense amplifier node or line. In a corresponding manner, the inverted bit line bBL0 connects the gates of the series-connected transistors P2, N2 of the read/write amplifier to the drains of the transistors P3, N3. A common node bSA0 is likewise referred to as a sense amplifier node or line. The function of the sense amplifier 20 is as follows, in a simplified explanation. By way of example, if the sense amplifier node SA0 is pulled in the direction of 0 V after the switch-on of the turn-off transistor N4 by the bit line BL0 by a cell signal and the NMOS transistors or by a write signal, then the PMOS read/write amplifier transistor P3 turns on. As a result, the inverted sense amplifier node bSA0 is pulled to the signal, e.g. 1.8 V, applied to the input PCS. In this case, the input PCS is provided by the PMOS driver transistor P1, which is driven correspondingly by the signal bPSET. The same applies correspondingly to the NCS side.

Figure 2:
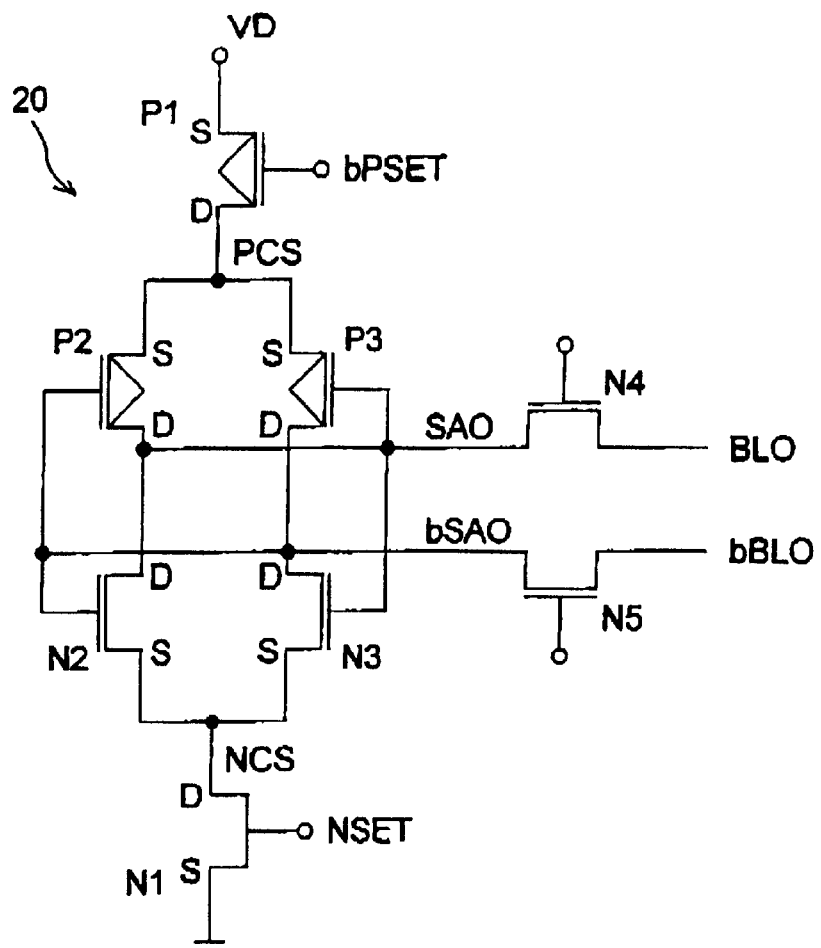
FIG. 2 is a basic circuit diagram of a sense amplifier of the semiconductor memory shown in FIG. 1.
Figure 3A:
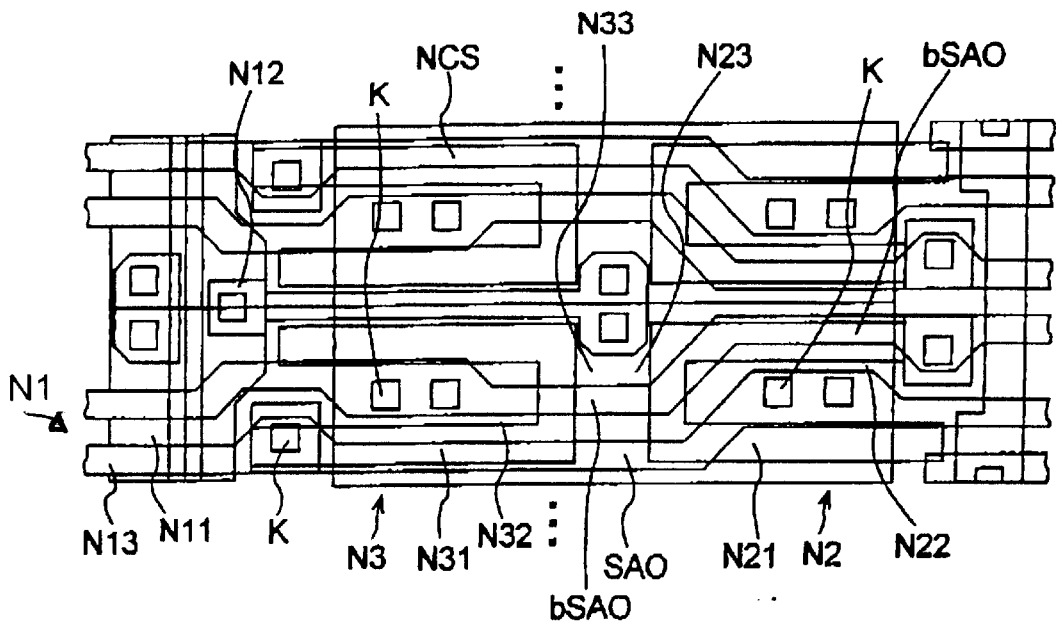
FIGS. 3A and 3B are simplified plan views of a layout of the sense amplifier configuration in accordance with FIG. 2 in accordance with the prior art.
Figure 3B:
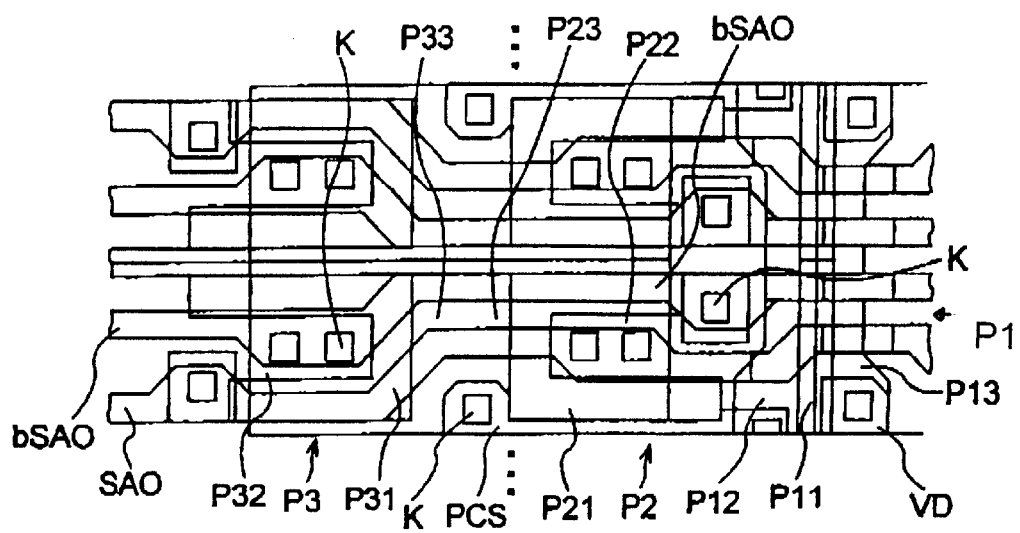

A known layout of the semiconductor memory having sense amplifiers in accordance with the amplifier 20 from FIGS. 1 and 2 in accordance with the prior art is shown in FIGS. 3A and 3B. In this case, only two of the numerous read/write amplifier rows are illustrated, for reasons of simplification. They are disposed one under the other, extending from left to right as strips in the form of rows, read/write amplifiers with the associated circuit elements and their doping and metalization regions. Perpendicularly thereto, the two driver transistors N1, P1, extending from top to bottom on the left and right on an edge side of the numerous read/write amplifiers as strips in the form of columns, enclose the respective read/write amplifier transistors N2, N3, P2, P3 of the read/write amplifier rows. In this case, the doping and metalization regions of gate N11, drain N12 and source N13 of the driver transistor N1 are each disposed in a manner correspondingly running perpendicularly. The same applies correspondingly to gate P11, drain P12 and source P13 of the PMOS driver transistor P1 disposed opposite. The C-shaped and mirrored C-shaped structures adjoining the strips of the driver transistor P1 on the inner side are the gates P21, P31 of the PMOS transistors P2, P3 of the read/write amplifier. The drain regions P22, P32 of the PMOS transistors P2, P3 extend inside the gates P21, P31. The gates P21, P31 are in turn surrounded by the source doping regions P23, P33 of the PMOS transistors P2, P3. The two bit lines BL0, bBL0 and the two sense amplifier lines SA0, bSA0 extend from left to right in FIGS. 3A, 3B. The various circuit elements of the sense amplifier 20 are connected up to one another via line strips and contacts K in accordance with the basic circuit diagram in FIG. 2. On the left beside the PMOS side of the read/write amplifier, the NMOS transistors N2, N3 are connected up in a corresponding manner (in accordance with FIG. 2), and also the strips—running perpendicularly thereto—of the NCS driver transistor N1 with the doping and metalization regions N11, N12, N13, N21, N22, N23, N31, N32 and N33.

Figure 4A:
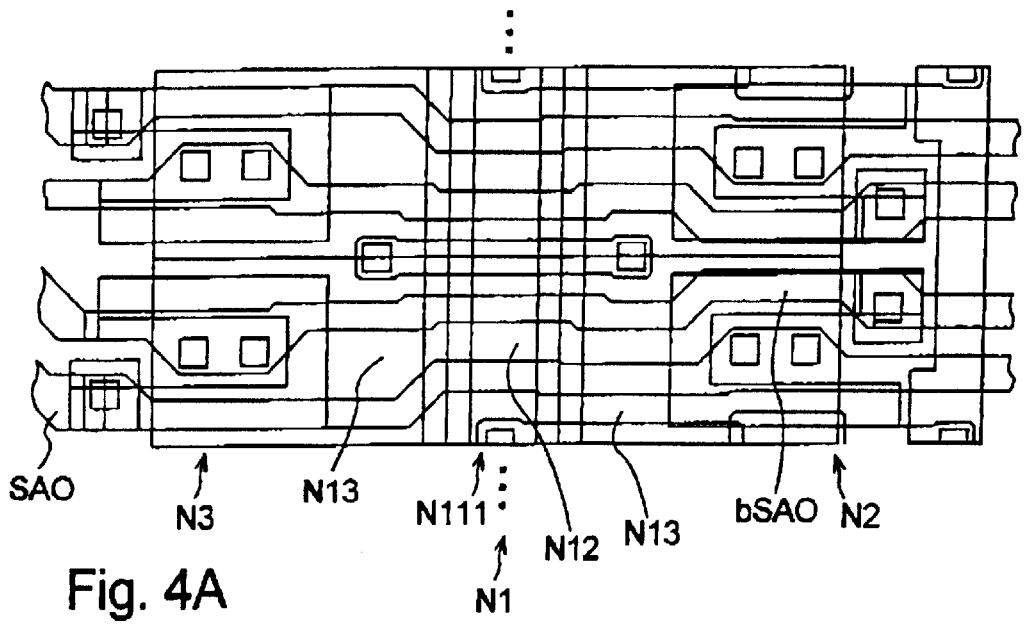
FIGS. 4A and 4B are simplified plan views of the layout of the sense amplifier configuration according to the invention.
Figure 4B:
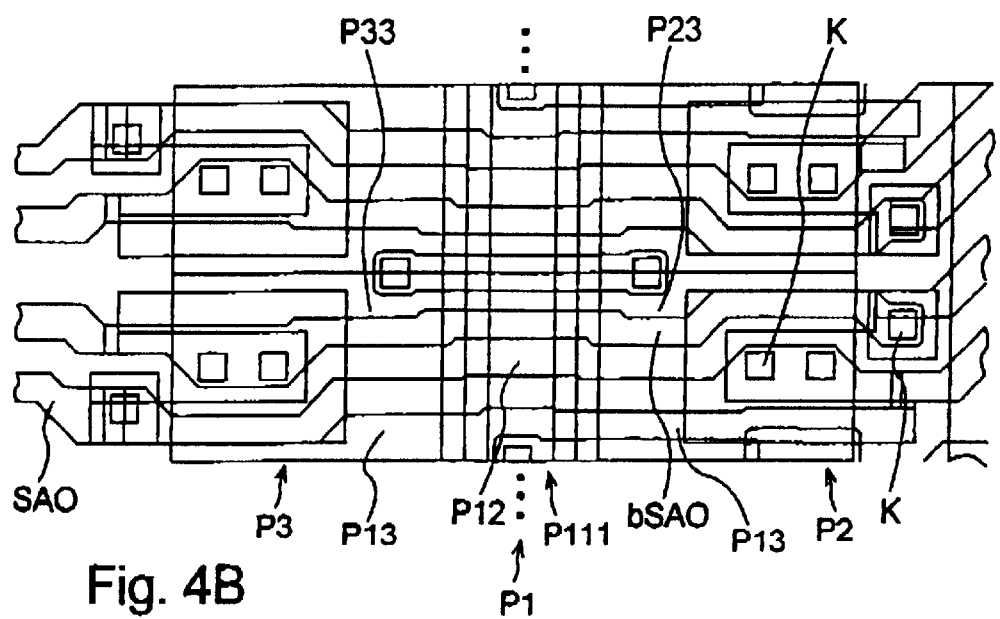

FIGS. 4A and 4B shows the layout of the sense amplifier configuration according to the invention, which layout is improved in comparison with FIGS. 3A and 3B. In this case, once again only two of the numerous read/write amplifier rows are illustrated, for reasons of simplification. In accordance with FIGS. 4A and 4B, the driver transistor P1 is placed in the center between the two PMOS transistors P2 and P3 of the read/write amplifier 20 and the corresponding PMOS transistors of the further read/write amplifiers of the semiconductor memory which are disposed below and above the read/write amplifier 20. The driver transistor P1 extends perpendicularly to the read/write amplifier rows in FIGS. 4A and 4B from top to bottom. In this case, the driver transistor P1 is configured with a two-strip gate P111. The drain P12 of the driver transistor P1 is disposed between these two spaced-apart partial gates P111 extending in the form of strips from top to bottom. Depending on application-specific wishes, the two partial gates can also be angled in sections or be disposed with different spacings. The doping regions of the source P13 of the driver transistor P1, which at the same time form the source regions P22, P33 of the PMOS read/write amplifier transistors P2, P3, run to the left and right of the two partial gates P111. The source P13 of the driver transistor P1 is connected via PCS strips to the sources P23, P33. Furthermore, with corresponding contacts K and line strips, the transistors of the sense amplifier 20 are interconnected and connected up to the two bit lines BL0, bBL0 and the two sense amplifier lines SA0, bSA0 in accordance with the basic circuit diagram in FIG. 2. The same applies correspondingly to the N side of the sense amplifier 20, the widths of the NMOS read/write amplifier transistors N2, N3 being distinctly reduced in comparison with the layout shown in FIGS. 3A, 3B. The layout shown in FIGS. 4A, 4B enables the widths of the NCS and, in particular, of the PCS driver transistor P1 to be doubled, without the area required for the sense amplifier 20 appreciably increasing. The doubling of the PCS driver capability makes it possible to considerably accelerate the signal development in the sense amplifier 20 or in the read/write amplifier and all other read/write amplifiers that are driven simultaneously by the driver transistor P1, this being described in FIG. 6. On the other hand, the effective area requirement can again be reduced through smaller dimensioning of the width of the NMOS transistors N2, N3 in the read/write amplifiers. The reduction in width of the NMOS sense amplifier including a configuration of the NCS driver transistor N1 corresponding to the PMOS side of the sense amplifier is shown on the left-hand side in FIGS. 4A, 4B.

Figure 5:
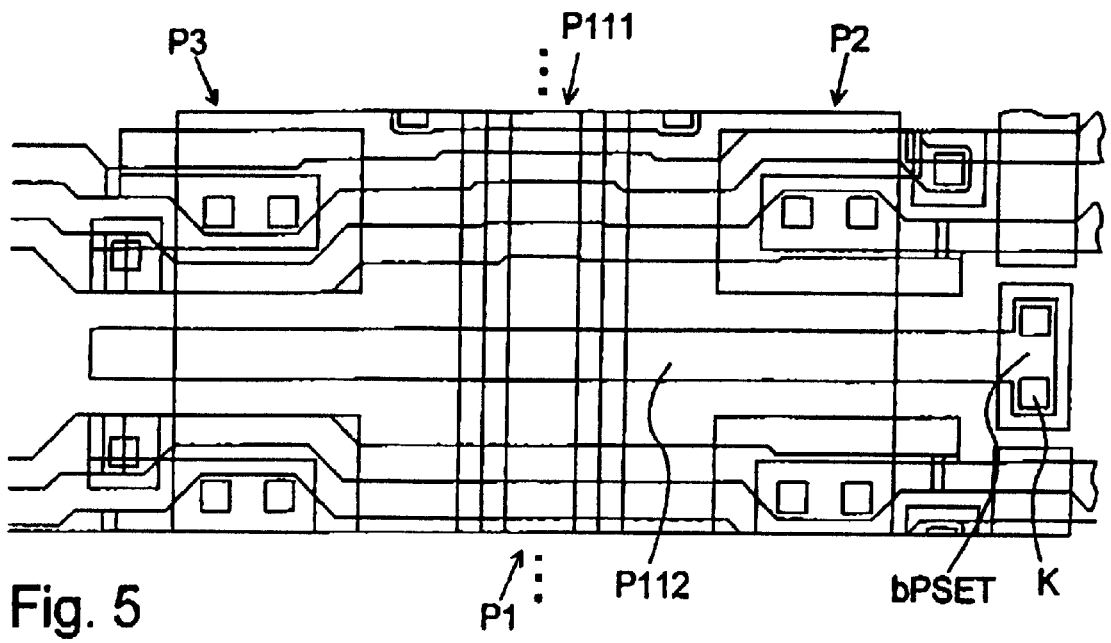
FIG. 5 is a plan view of another section of the layout of the sense amplifier configuration.

The insertion of a gate transverse web 112 which, in a modification of the illustration in FIGS. 4A, 4B, connects the two strips of the two-strip gate 111 of the driver transistor P1 to one another is shown by way of example in FIG. 5. This measure leads to the balancing of the PCS signal supply of the PMOS transistors of the read/write amplifier and, moreover, enables optimization of the capacitive load of the drive signal. The edge steepness of the drive signal can be optimized by this load variation. In addition, the transverse webs ensure the geometrical symmetry of the sense transistors, as a result of which a tendency to tilt in one direction can be suppressed, and, consequently, the sense operation can be ensured even at lower input levels, that is to say even more quickly. The gate transverse web 112 extends from left to right to a point in the edge region of the read/write amplifier transistor P2 illustrated on the right in FIG. 5. As a result, via the contacts K, the bPSET signal can be fed in a simple manner to the gate P11 of the driver transistor P1.

Figure 6:
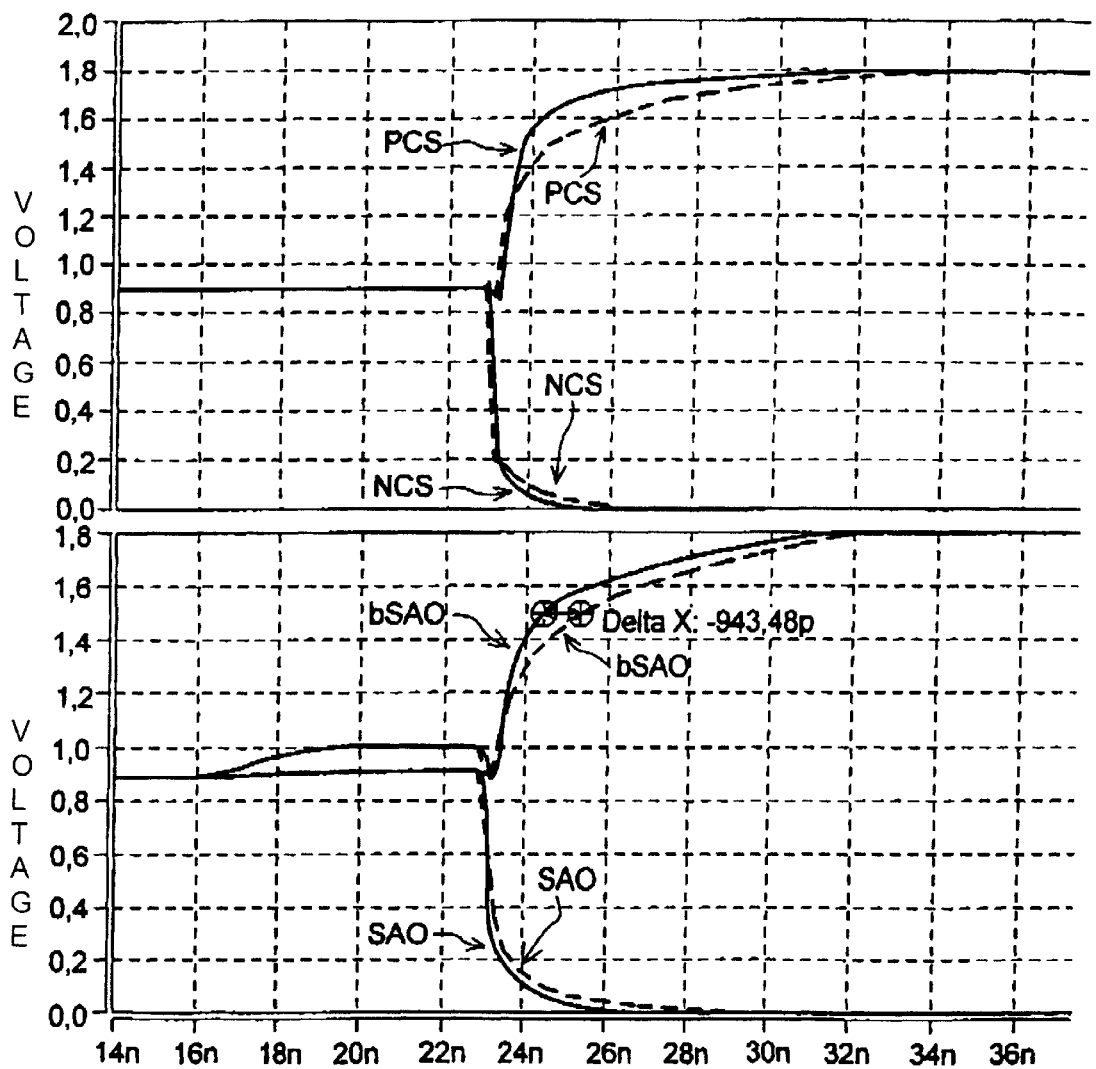
FIG. 6 is a timing diagram of the signal development in a sense amplifier having the layout according to FIGS. 4A and 4B.

Simulation results of the signal development during a sense amplification operation in the sense amplifier 20 with the layout according to the known prior art (FIGS. 3A, 3B) and the layout according to the invention (FIGS. 4A, 4B, and 5) are compared and contrasted in FIG. 6. In this case, the signal development in the case of a sense amplifier having a layout according to FIGS. 3A, 3B is illustrated by dashed lines and the signal development in the case of a sense amplifier having the layout according to the invention according to FIGS. 4A, 4B is illustrated by solid lines. In a precharge state, the potentials of the sense amplifier line SA0, bSA0 have the same magnitude and are e.g. about 0.9 V. When the word line WL0 is switched on, a small voltage difference of, for example, about 80 mV forms between the two bit lines BL0 and bBL0 and at the two sense amplifier nodes SA0 and bSA0. The control signal NSET pulls the potential of the read/write amplifier node NCS from about 0.9 V to 0 V. In a corresponding manner, the sense amplifier node SA0 is than also pulled to 0 V in a slightly delayed manner via the read/write amplifier. The read/write amplifier node PCS is correspondingly developed to 1.8 V and, following it, the sense amplifier node bSA0 is likewise pulled to 1.8 V. In this case, the control signal bPSET is produced from the control signal NSET in accordance with the exemplary embodiment. Due to the layout of the sense amplifier according to FIGS. 4A, 4B, in accordance with FIG. 6 the side developed by the PMOS transistors P1, P2, P3 is developed up to 1 ns faster compared with the prior art having the layout in accordance with FIGS. 3A, 3B.

We claim:

1. A sense amplifier for a semiconductor memory, comprising:

a plurality of read/write amplifiers extending as strips in rows one under another and having NMOS and PMOS transistors;

two driver transistors connected to said read/write amplifiers, said two driver transistors being strip shaped and extending perpendicularly to said read/write amplifiers in a form of columns over said rows of said read/write amplifiers, at least one of said two driver transistors having doping in regions disposed between associated ones of one of said NMOS transistors and said PMOS transistors of said read/write amplifiers, and said at least one of said two driver transistors having a gate formed as a two-strip gate with two strips; and non-inverted and inverted bit lines extending in said rows of said read/write amplifiers.

2. The sense amplifier according to claim 1, including gate transverse webs, and said at least one of said two driver transistors having a channel width and said two strips of said two-strip gate are conductively connected to one another by said gate transverse webs over part of said channel width.

3. The sense amplifier according to claim 2, wherein each of said gate transverse webs extends parallel to a respective one of said read/write amplifiers in a form of a strip at least in an outer edge region thereof.

4. A layout of a sense amplifier configuration for a semiconductor memory, comprising:

a plurality of read/write amplifiers extending as strips in rows one under another and having NMOS and PMOS transistors;

two driver transistors connected to said read/write amplifiers, said two driver transistors being strip shaped and extending perpendicularly to said read/write amplifiers in a form of columns over said rows of said read/write amplifiers, at least one of said two driver transistors having doping regions disposed between associated ones of one of said NMOS transistors and said PMOS transistors of said read/write amplifiers, and said at least one of said two driver transistors having a gate formed as a two-strip gate with two strips; and non-inverted and inverted bit lines extending in said rows of said read/write amplifiers.

5. The layout of the sense amplifier configuration according to claim 4, including gate transverse webs, and said at least one of said two driver transistors having a channel width and said two strips of said two-strip gate are conductively connected to one another by said gate transverse webs over part of said channel width.

6. The layout of the sense amplifier configuration according to claim 5, wherein each of said gate transverse webs extends parallel to a respective one of said read/write amplifiers in a form of a strip at least in an outer edge region thereof.

7. A layout of a sense amplifier configuration for a semiconductor memory, the sense amplifier comprising:

a plurality of read/write amplifiers extending as strips in rows one under another and having NMOS and PMOS transistors;

non-inverted and inverted bit lines extending in said rows of said read/write amplifiers; and two driver transistors connected to said read/write amplifiers and being strip shaped and extending perpendicularly to said read/write amplifiers in a form of columns over said rows of said read/write amplifiers, at least one of said two driver transistors having doping regions disposed between associated ones of one of said NMOS transistors and said PMOS transistors of said read/write amplifiers, and said at least one of said two driver transistors having a gate formed as a two-strip gate with two strips.

8. The layout of a sense amplifier configuration according to claim 7, including gate transverse webs, said at least one of said two driver transistors having a channel width and said two strips of said two-strip gate conductively connected to one another by said gate transverse webs over part of said channel width.

9. The layout of a sense amplifier configuration according to claim 8, wherein each of said gate transverse webs extends parallel to a respective one of said read/write amplifiers in a form of a strip at least in an outer edge region thereof.

* * * * *